(12) United States Patent
Lin et al.

(10) Patent No.: US 8,760,857 B2
(45) Date of Patent: Jun. 24, 2014

(54) USB DEVICE WITH ROTATABLE HEAD

(75) Inventors: Shih-Wei Lin, New Taipei (TW);
Tzu-Hsiu Hung, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 214 days.

(21) Appl. No.: 13/315,303

(22) Filed: Dec. 9, 2011

(65) Prior Publication Data

US 2013/0050921 A1 Feb. 28, 2013

(30) Foreign Application Priority Data

Aug. 24, 2011 (TW) .............................. 100215779 A

(51) Int. Cl.
*H05K 7/00* (2006.01)

(52) U.S. Cl.
USPC .............. 361/679.31; 361/679.32; 455/575.3; 206/38; 439/131; 439/135; 439/142; 439/372; 396/419; 396/428

(58) Field of Classification Search
USPC .................... 206/38; 439/131, 135, 142, 372; 455/575.2, 575.3; 361/679.31, 679.32, 361/755; 396/419, 428
See application file for complete search history.

(56) References Cited

U.S. PATENT DOCUMENTS

| | | | | |
|---|---|---|---|---|
| 7,530,823 | B1 * | 5/2009 | Thornton et al. | 439/136 |
| 7,577,467 | B2 * | 8/2009 | Schechtel et al. | 455/575.4 |
| 7,632,113 | B2 * | 12/2009 | Finn | 439/131 |
| 2006/0068859 | A1 * | 3/2006 | Lee et al. | 455/575.4 |
| 2006/0073717 | A1 * | 4/2006 | Ng et al. | 439/131 |
| 2006/0084284 | A1 * | 4/2006 | Hsieh | 439/31 |
| 2009/0215284 | A1 * | 8/2009 | Zhao et al. | 439/55 |
| 2010/0210314 | A1 * | 8/2010 | Wang et al. | 455/569.1 |
| 2010/0287732 | A1 * | 11/2010 | Fang et al. | 16/250 |
| 2011/0073498 | A1 * | 3/2011 | Palmer | 206/38 |
| 2012/0015534 | A1 * | 1/2012 | Wavra et al. | 439/131 |

* cited by examiner

*Primary Examiner* — Hung S Bui
*Assistant Examiner* — James Wu
(74) *Attorney, Agent, or Firm* — Novak Druce Connolly Bove + Quigg LLP

(57) ABSTRACT

An exemplary USB device includes a base including a body and a pair of arms extending from the body, a head rotatably positioned between the pair of arms, and a pair of wheels fixed to the head. When the base is gripped by a user and oriented at an oblique angle relative to an external surface, with the at least one wheel contacting the surface, and the base is moved by the user in a direction generally parallel to the surface, the head is capable of rotating relative to the base by reason of friction between the wheels and the surface, and the head is opened out from the base and is secured in position at a desired angle with respect to the base when the user ceases moving the base.

11 Claims, 5 Drawing Sheets

USB DEVICE WITH ROTATABLE HEAD

BACKGROUND

1. Technical Field

The present disclosure generally relates to universal serial bus (USB) devices, and especially to a USB device with a rotatable head.

2. Description of Related Art

Universal serial bus (USB) devices are popular with customers due to their portability and fashionable appearance. A USB device generally comprises a body comprising a receiving hole, and a head received in the receiving hole. The USB device usually employs hinges installed between the body and the head in order to rotate or swivel the head relative to the body to open or close the USB device. Therefore, how to allow the USB device to be opened quickly for use is an ongoing concern for industrial designers and manufacturers.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

Figure 1:
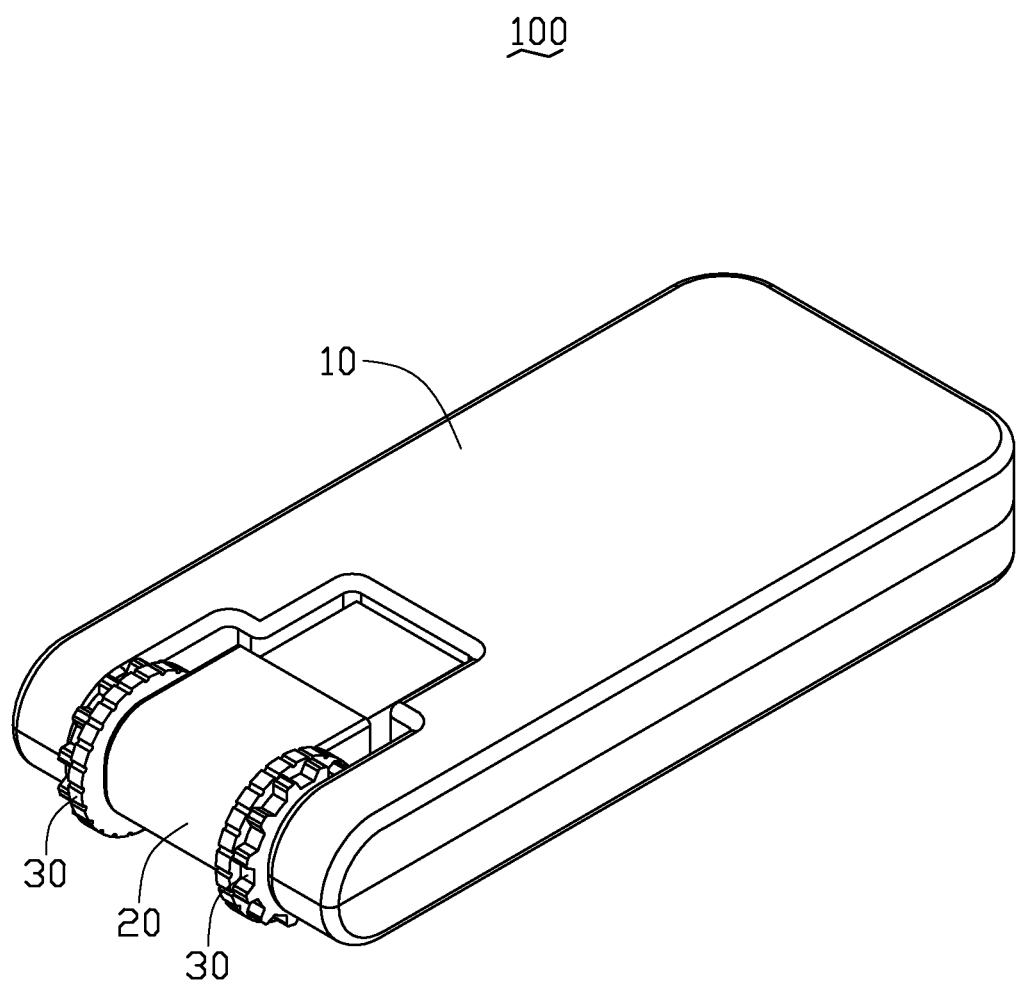
FIG. 1 is a first perspective view of a USB device of an exemplary embodiment of the disclosure.

The disclosure is illustrated by way of example and not by way of limitation in the figures of the accompanying drawings, in which like reference numerals indicate similar elements. It should be noted that references to "an" or "one" embodiment in this disclosure are not necessarily to the same embodiment, and such references can mean "at least one" embodiment.

Figure 2:
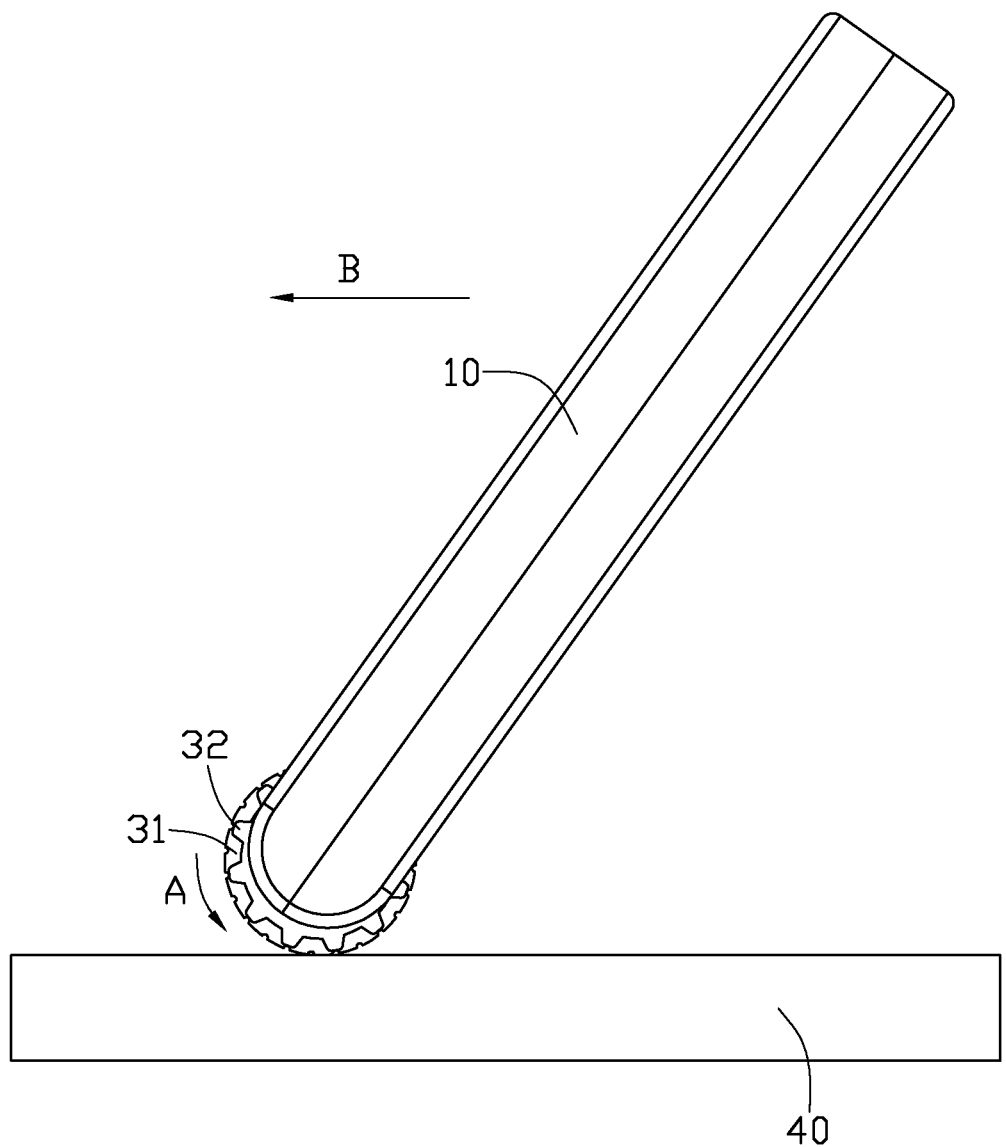
FIG. 2 is a side plan view of the USB device of FIG. 1, showing the USB device rolling along a desktop.
Figure 3:
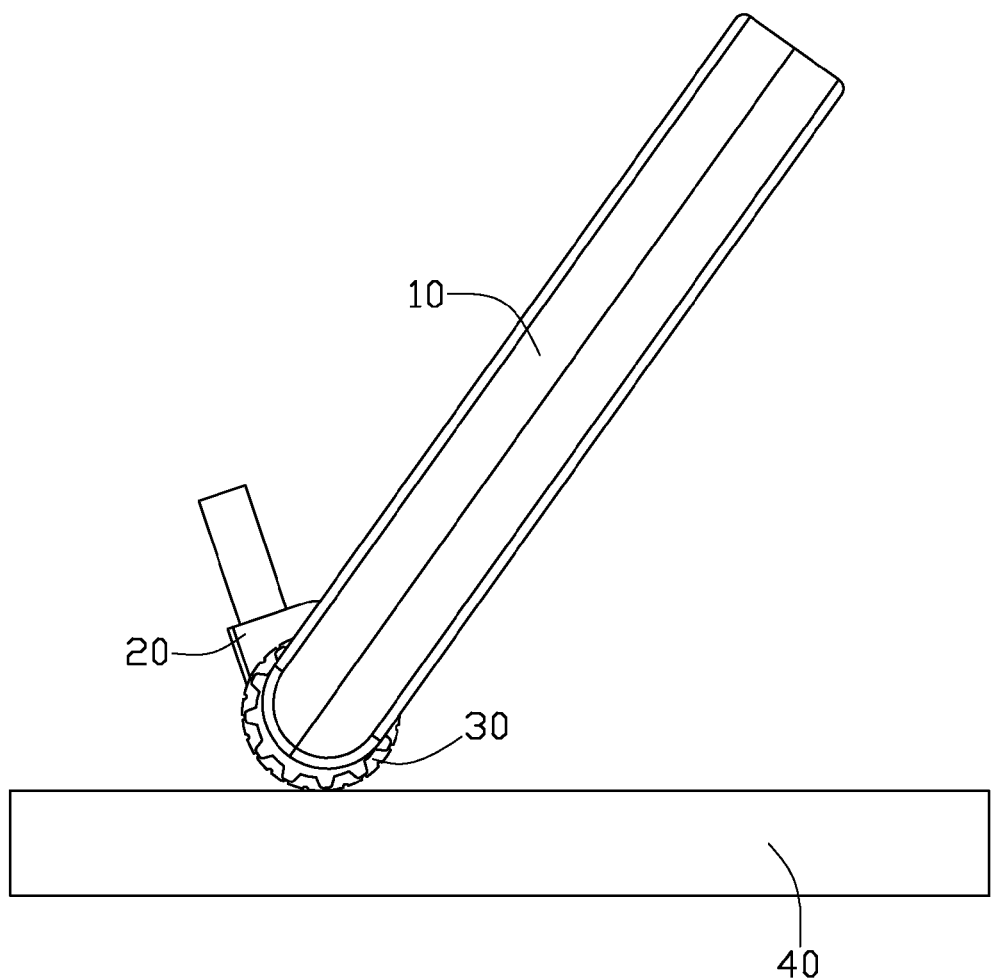
FIG. 3 is similar to FIG. 2, but showing a head of the USB device opened out from a base of the USB device.

With reference to FIGS. 1-3, a USB device 100 comprises a base 10, a head 20 rotatably connected with the base 10, and a pair of wheels 30 respectively positioned between the base 10 and the head 20. When the pair of wheels 30 press on a resisting portion 40 and roll along the resisting portion 40, the head 20 is capable of rotating relative to the base 10 by reason of friction between the pair of wheels 30 and the resisting portion 40. As a result, the head 20 is opened out from the base 10, and can be secured in position at a desired angle with respect to the base 10, as shown in FIG. 3.

In the embodiment, the resisting portion 40 is a desktop or a tabletop. Alternatively, the resisting portion 40 can be a finger of an operator.

Figure 4:
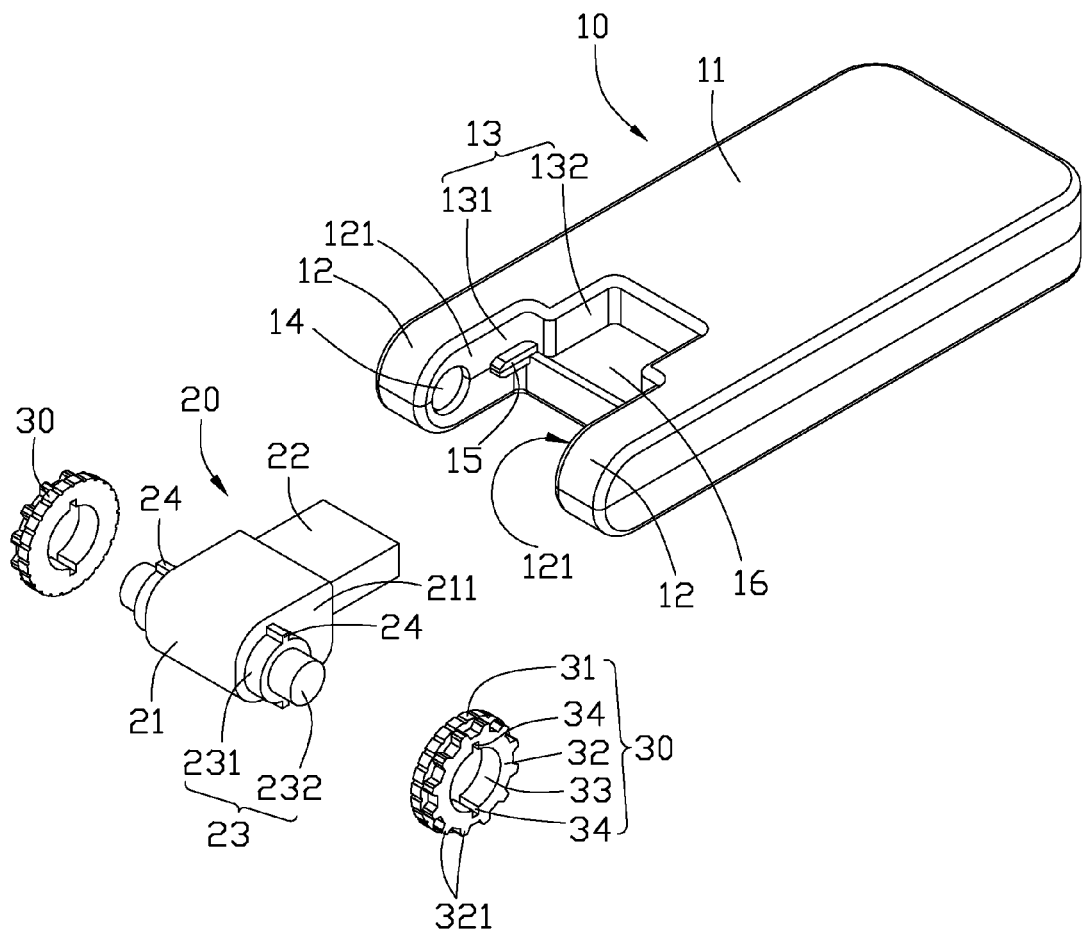
FIG. 4 is a disassembled view of the USB device of FIG. 1.

With reference to FIG. 4, the base 10 comprises a body 11, a pair of arms 12 extending from one end of the body 11 and being parallel to each other, and at least one stopper portion 15 projecting from an inner side 121 of at least one of the pair of arms 12. The pair of arms 12 and the body 11 collectively define a receiving groove 13. Each of the pair of arms 12 defines a receiving hole 14 on the inner side 121 thereof.

In the embodiment, the receiving groove 13 defines a first receiving portion 131 and a second receiving portion 132 communicating with the first receiving portion 131. A step 16 is provided at a bottom of the second receiving portion 132. In the illustrated embodiment, the base 10 comprises a pair of stopper portions 15 respectively projecting from the two opposite inner sides 121 of the pair of arms 12, and being adjacent to the second receiving portion 132. The base 10 and the pair of stopper portions 15 are integrally formed, and are made of plastic.

The head 20 comprises a connecting portion 21, a pair of shafts 23 respectively extending from two sides 211 of the connecting portion 21, and an inserting portion 22 extending from the connecting portion 21. The USB device 100 is connected to an electronic device (not shown) by the inserting portion 22 being inserted into an electrical connector of the electronic device.

Each of the pair of wheels 30 comprises a friction wheel 31 and a stopper wheel 32 extending coaxially from the friction wheel 31. The friction wheel 31 and the stopper wheel 32 have a common center axis. A shaft hole 33 is defined in the wheel 30, and extends through the friction wheel 31 and the stopper wheel 32. The stopper wheel 32 comprises a plurality of projections 321 spaced evenly apart from each other along a circumferential periphery (not labeled) thereof. In use, the projections 321 of the wheels 30 match with the stopper portions 15 of the base 10, respectively, to allow the head 20 to be positioned at a desired angle with respect to the base 10.

In the embodiment, each of the pair of shafts 23 comprises a first part 231, and a second part 232 extending coaxially from the first part 231. The first part 231 is configured between the connecting portion 21 and the second part 232. The first part 231 and the second part 232 provide the shaft 23 with a shape in the form of a stepped post or pole. The first part 231 comprises a pair of opposite positioning keys 24 radially projecting from a main body thereof. Each of the pair of wheels 30 defines a pair of positioning slots 34 in an inner surface of the shaft hole 33. The positioning slots 34 correspond to the keys 24 of a respective shaft 23.

In assembly, each of the pair of wheels 30 is positioned around the first part 231 of a corresponding shaft 23, with the pair of positioning keys 24 respectively engagingly received in the pair of positioning slots 34. The second parts 232 of the pair of shafts 23 are respectively received in the receiving holes 14 of the base 10, and are capable of rotating in the receiving holes 14. The connecting portion 21 is received in the first receiving portion 131, and the inserting portion 22 is received in the second receiving portion 132 and supported by the step 16. With this configuration, the pair of wheels 30 are respectively secured to the pair of shafts 23 firmly, and are capable of rotating in unison with the head 20 relative to the base 10.

Figure 5:
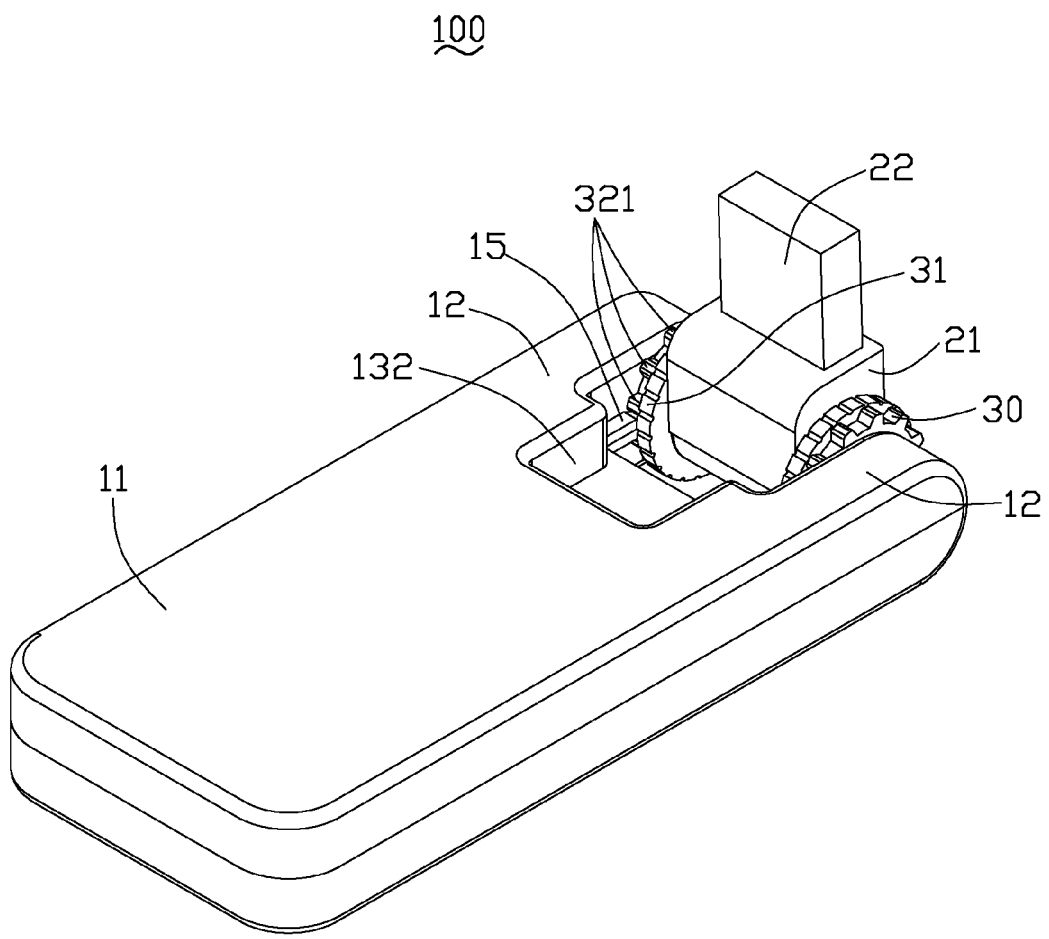
FIG. 5 is another perspective view of the USB device of FIG. 1, but viewed from a different aspect, and showing the head of the USB device opened out and two projections of a stopper wheel engaged with a stopper portion of the base.

With reference to FIG. 2 and FIG. 3, in use, the pair of wheels 30 are pressed against the resisting portion 40 and rolled along a first direction (as shown by arrow A) by reason of an external force applied by a user, and the USB device 100 synchronously moves linearly along a second direction (as shown by arrow B). Subsequently, friction force between the pair of wheels 30 and the resisting portion 40 enables the head 20 of the USB device 100 to rotate relative to the base 10 and exit the receiving groove 13. When the head 20 has rotated to a desired angle, one of the projections 321 of each of the pair of stopper wheels 30 automatically engages with a corresponding stopper portion 15 of the base 10, and the user stops applying the external force. As a result, a free end of each stopper portion 15 of the base 10 fits neatly between two adjacent projections 321 of the corresponding stopper wheel 30, and the head 20 stops rotating. That is, the stopper portions 15 function similarly to pawls, and the head 20 is opened out at the desired angle, as shown in FIG. 5. In the embodiment, the projections 321 of the stopper wheel 32 are evenly spaced apart from each other by 30 degrees, and the head 20 is accordingly stoppable one time per 30 degrees of rotation. Accordingly, the desired angle can be 30 degrees, or a multiple of 30 degrees such as 60 degrees or 90 degrees.

Alternatively, the angle between each two projections 321 can be set according to requirements of customers. The head 20 can be positioned relative to the base 10 at any of a plurality of different angles.

In the embodiment, a largest external diameter of the stopper wheel 32 must less than or equal to that of the friction wheel 31. That is, the projections 321 are not positioned beyond the circumferential periphery of the friction wheel 31, to ensure that the friction wheel 31 can effectively contact the resisting portion 40.

In the embodiment, the pair of wheels 30 are made of rubber, which strengthens the friction between the friction wheels 30 and the resisting portion 40, which in turn enables the head 20 to be opened out quickly.

In summary, the head 20 of the USB device 100 opens out by reason of the friction between the wheels 30 and the resisting portion 40, as long as the wheels 30 are able to resist the resisting portion 40 and roll along the resisting portion 40. The USB device 100 thus brings the user (customer) a convenient, novel and useful experience.

Although the features and elements of the present disclosure are described as embodiments in particular combinations, each feature or element can be used alone or in other various combinations within the principles of the present disclosure to the full extent indicated by the broad general meaning of the terms in which the appended claims are expressed.

What is claimed is:

1. A universal serial bus (USB) device, comprising:
  a base comprising a body, a pair of arms extending from one end of the body and parallel to each other, and a pair of stopper portions extending from inner sides of the pair of arms, the body and the pair of arms collectively defining a receiving groove;
  a head rotatably connected between the pair of arms; and
  a pair of wheels, respectively fixed to two sides of the head and located between the head and the pair of arms, each of the pair of wheels comprising a friction wheel and a stopper wheel extending coaxially from the friction wheel, each of the stopper wheels comprising a plurality of projections located on a circumferential periphery thereof and spaced from each other;
  wherein when the wheels are rotated in a same direction and then the rotation is stopped, at least one of the projections of each of the stopper wheels engages with a corresponding one of the stopper portions of the base to position the head relative to the base.

2. The USB device of claim 1, wherein the base defines a pair of receiving holes respectively located on the pair of arms and opposite to each other, and the head comprises a pair of shafts respectively extending into the pair of receiving holes and capable of rotating in the pair of receiving holes.

3. The USB device of claim 2, wherein each of the pair of wheels defines a shaft hole extending through the friction wheel and the stopper wheel, and the pair of shafts respectively insert through the shaft holes of the pair of wheels and fixed with the pair of wheels.

4. The USB device of claim 3, wherein each of the pair of shafts comprises at least one key radially projecting from an exterior surface of the shaft, and each of the pair of wheels defines at least one slot in an inner surface of the shaft hole of the wheel, and the at least one key is received in the at least one slot to fix the shaft and the wheel together.

5. The USB device of claim 4, wherein each of the shafts comprises a first part extending from a corresponding side of the head, and a second part extending coaxially from the first part, and wherein the first part and the second part provide the shaft with a shape in the form of a stepped post, the at least one key is positioned on the first part, and the second part is received in a corresponding receiving hole of the base.

6. The USB device of claim 1, wherein the plurality of the projections are evenly spaced from each other by 30 degrees on a circumferential periphery of the stopper wheel.

7. The USB device of claim 1, wherein the pair of wheels are made of rubber.

8. The USB device of claim 1, wherein the receiving groove defines a first receiving portion and a second receiving portion, the base comprises a pair of stopper portions respectively extending from two opposite inner sides of the pair of arms and adjacent to the second receiving portion.

9. The USB device of claim 8, wherein the head comprises a connection portion and an inserting portion extending from the connecting portion, and the connecting portion and the inserting portion are respectively received in the first receiving portion and the second receiving portion.

10. A universal serial bus (USB) device, comprising:
  a base comprising a body and a pair of arms extending from the body;
  a head rotatably positioned between the pair of arms; and
  at least one wheel fixed to the head;
  wherein when the base is gripped by a user and oriented at an oblique angle relative to an external surface, with the at least one wheel contacting the surface, and the base is moved by the user in a direction generally parallel to the surface, the head is capable of rotating relative to the base by reason of friction between the at least one wheel and the surface, and the head is opened out from the base and is secured in position at a desired angle with respect to the base when the user ceases moving the base; and
  wherein the base further comprises at least one stopper portion extending from an inner side of at least one of the pair of arms, the at least one wheel comprises a stopper wheel, and the stopper wheel comprises a plurality of projections located on a circumferential periphery thereof and spaced from each other, and when the head is secured in position at the desired angle with respect to the base, one of the projections of the stopper wheel is engaged with the at least one stopper portion of the base.

11. The USB device of claim 10, wherein the at least one wheel further comprises a friction wheel, the stopper wheel extends coaxially from the friction wheel, the friction wheel contacts the surface, and the head is capable of rotating relative to the base by reason of friction between the friction wheel and the surface.

* * * * *